(12) United States Patent
Fournier et al.

(10) Patent No.: US 7,619,295 B2
(45) Date of Patent: Nov. 17, 2009

(54) PINCHED POLY FUSE

(75) Inventors: Paul R. Fournier, Scarborough, ME (US); Susan Stock, Wolfeboro, NH (US)

(73) Assignee: Fairchild Semiconductor Corporation, South Portland, ME (US)

( * ) Notice: Subject to any disclaimer, the term of this patent is extended or adjusted under 35 U.S.C. 154(b) by 173 days.

(21) Appl. No.: 11/869,862

(22) Filed: Oct. 10, 2007

(65) Prior Publication Data

US 2009/0096058 A1    Apr. 16, 2009

(51) Int. Cl.
*H01L 29/00* (2006.01)
(52) U.S. Cl. ............... 257/529; 257/E29.001; 257/E21.002; 438/601
(58) Field of Classification Search .......... 257/529, 257/E21.003, E29.005; 438/601
See application file for complete search history.

(56) References Cited

U.S. PATENT DOCUMENTS

| 4,494,135 | A | * | 1/1985 | Moussie | ............... 257/50 |
|---|---|---|---|---|---|
| 6,642,601 | B2 | | 11/2003 | Marshall et al. | |
| 6,956,277 | B1 | * | 10/2005 | Wu et al. | ............... 257/529 |
| 7,227,238 | B2 | | 6/2007 | Ito, et al. | |
| 2005/0258505 | A1 | | 11/2005 | Wu et al. | |
| 2006/0065946 | A1 | * | 3/2006 | Mehrad et al. | ............... 257/530 |
| 2007/0099326 | A1 | * | 5/2007 | Hsu et al. | ............... 438/48 |

OTHER PUBLICATIONS

Holzer, et al., "Extraction of Material Parameters Based on Inverse Modeling of Three-Dimensional Interconnect Structures," Ninth Therminic Workshop, Aix-en-Provence, France, Sep.24-26, 2003, pp. 263-268.

* cited by examiner

*Primary Examiner*—Trung Dang
(74) *Attorney, Agent, or Firm*—Thomas R. FitzGerald, Esq.; Hiscock & Barclay, LLP

(57) ABSTRACT

An electrical fuse has a region of a first conductivity type in a continuous type polysilicon of a second conductivity type that is opposite the first conductivity type. In one embodiment of the invention the PN junction between the region and the poly fuse is reverse biased.

18 Claims, 4 Drawing Sheets

US 7,619,295 B2

PINCHED POLY FUSE

FIELD OF THE INVENTION

This invention relates to electrically blown fuses in, or packaged with, semiconductor devices, and more particularly, to polysilicon electrically blown fuses.

BACKGROUND OF THE INVENTION

Polysilicon fuses are used in semiconductor devices or packages due to their advantages including the ability to be blown without an opening to allow fused by-products to escape as required with metal fuses. Polysilicon fuses can thus be used for trimming during wafer sort, final test, and in customer applications.

Typically polysilicon fuses have a layer of silicide over the fuse to form a low resistance conductor for the current densities required to generate the heat to create a discontinuity in the polysilicon and in the silicide. However, the fuse must be designed, and the proper fuse current must be used to prevent the silicide flows from reforming the electrical connection across the fuse after it has been initially blown.

SUMMARY OF THE INVENTION

The invention comprises, in one form thereof, an electrical fuse having a region of a first conductivity type in a continuous polysilicon fuse of a second conductivity type opposite the first conductivity type.

In another form, the invention includes a method of forming a polysilicon fuse. The method comprises the steps of forming a first region of a continuous type polysilicon and forming a second region of a conductivity type opposite to the first region.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1A:
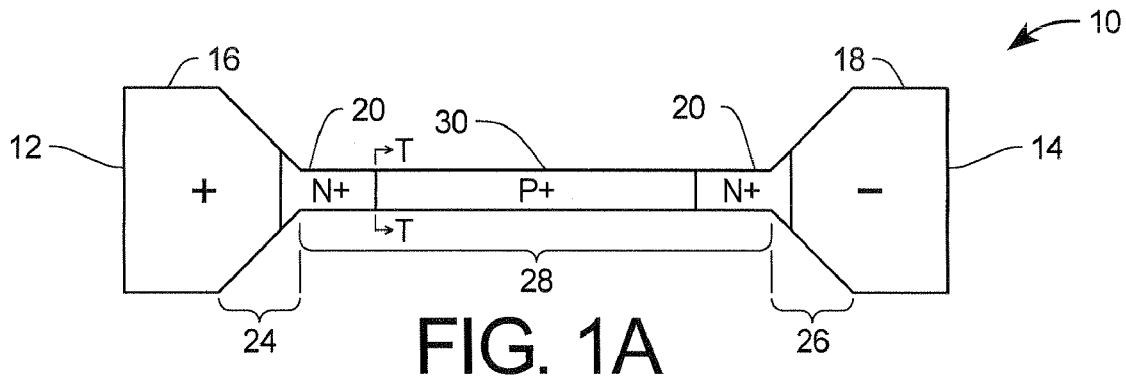
FIGS. 1A and 1B are respective top and side views of a first embodiment of a pinched poly fuse according to the present invention.

It will be appreciated that for purposes of clarity and where deemed appropriate, reference numerals have been repeated in the figures to indicate corresponding features. Also, the relative size of various objects in the drawings has in some cases been distorted to more clearly show the invention.

DETAILED DESCRIPTION

Figure 1B:
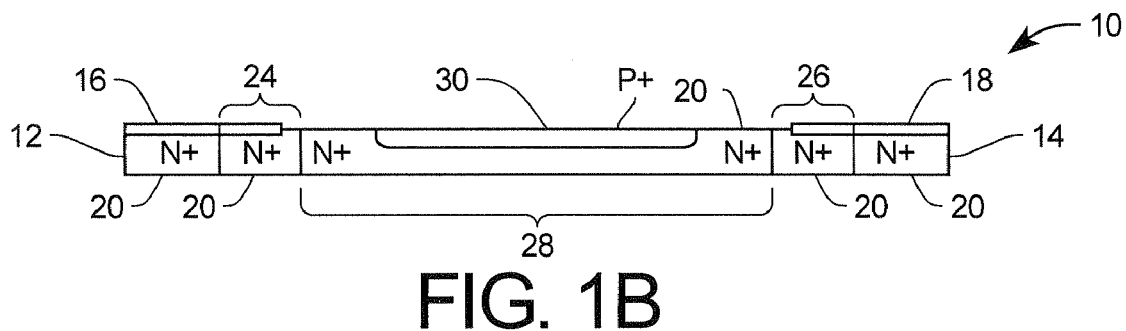

Turning now to the drawings, FIGS. 1A and 1B are respective top and side views of a first embodiment of a pinched poly fuse 10 according to the present invention. The poly fuse 10 has a "bow tie" configuration with a positive terminal 12 and a negative terminal 14 having respective silicide layers 16 and 18, which are formed using platinum in one embodiment of the present invention, over a portion of N+ polysilicon 20. The terminals 12 and 14 have respective neck-down regions 24 and 26 where the silicide layers 16, 18 end leaving only the polysilicon 20. Between the neck-down regions 24, 26 is a relatively narrow strip of a continuous type of polysilicon 28. In FIG. 1 the continuous type is N+. The polysilicon 20 is N+ except for an elongated P+ region 30 formed in the polysilicon 28 which extends from the top surface of the polysilicon 28 downward but not extending all the way to the bottom surface of the polysilicon 28.

The P+ region 30, formed by counter doping the N+ polysilicon 20, effectively "pinches" the N+ polysilicon 20 to concentrate the electron and hole carriers into a narrower region. Simulation has shown that the hottest portion of the N+ polysilion 20 is where the electrons exit from the high concentration region under the P+ region 30 as indicated by the reference letter "T" in FIG. 1A. T is the trim line where the N+ polysilicon 20 starts to open. As the N+ polysilicon 20 heats up and starts to lose its conductivity, the N+ polysilicon 20 is further "pinched" thus causing a rapid breakdown in the polysilicon at the trim line T.

In FIGS. 1A and 1B the silicide layers 16, 18 do not extend near enough to the trim line T to where the N+ polysilicon 20 heating will result in the platinum (in the case of a platinum silicide) melting and flowing across the fuse element.

Figure 2A:
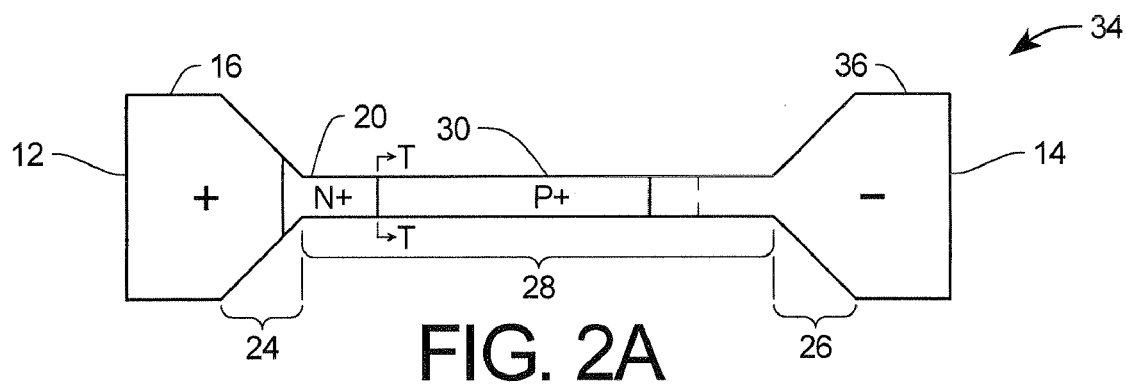
FIGS. 2A and 2B are respective top and side views of a second embodiment of a pinched poly fuse according to the present invention.
Figure 2B:
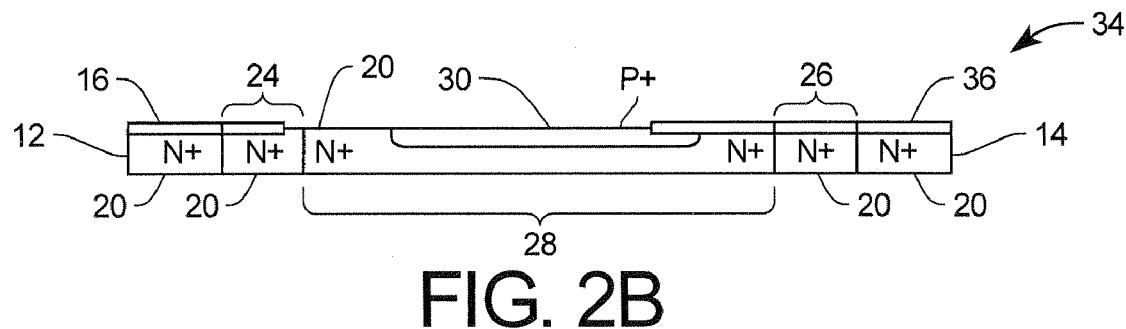

FIGS. 2A and 2B are respective top and side views of a second embodiment of a pinched poly fuse 34 according to the present invention in which the silicide 36 at the negative terminal extends over and contacts the P+ region 30 to reverse bias the junction between the N+ polysilicon 20 and the P+ region 30. It is believed that with a reverse bias the depletion region in the N+ polysilicon 20 around the P+ region 30 will further "pinch" the conductive region in the N+ polysilicon 20 under the P+ region 30.

Figure 3A:
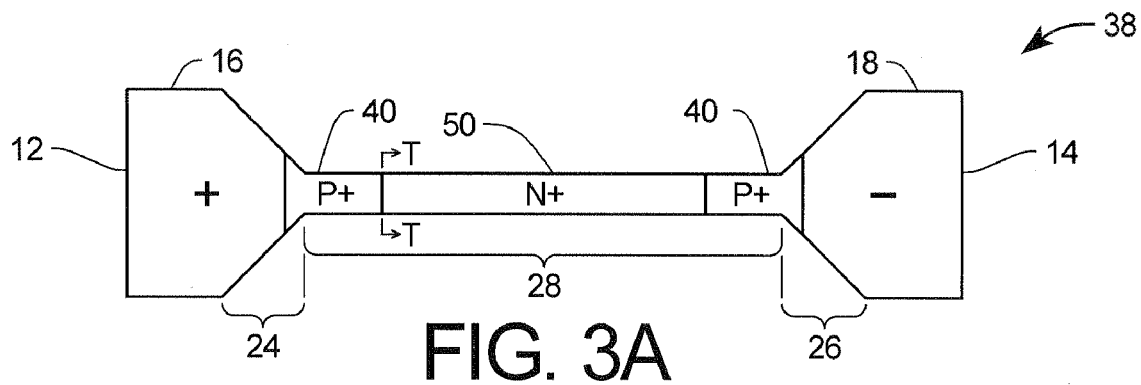
FIGS. 3A and 3B are respective top and side views of a third embodiment of a pinched poly fuse according to the present invention.
Figure 3B:
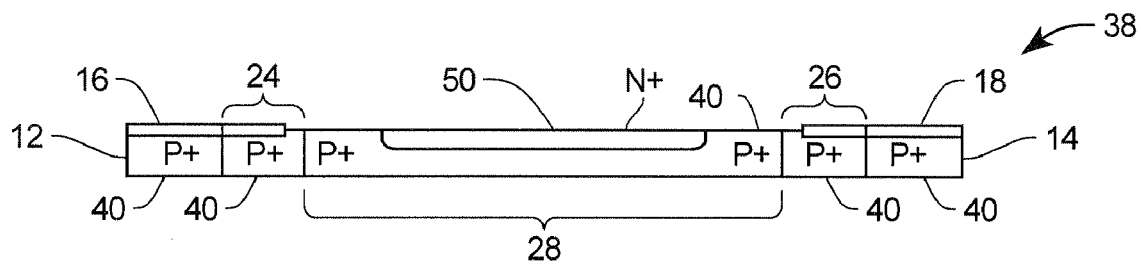

FIGS. 3A and 3B are respective top and side views of a third embodiment of a pinched poly fuse 38 according to the present invention which reverse dopant types as those in FIGS. 1A and 1B. Thus the pinched poly fuse 38 shown in FIGS. 3A and 3B have P+ polysilicon 40 extending from under the silicide 16 at the positive terminal of the pinched poly fuse 38 to under the silicide 18 at the negative terminal of the pinched poly fuse 38, respectively. Between the neck-down regions 24, 26 is the relatively narrow strip of continuous type polysilicon 28 with an N+ region 50 formed in the polysilicon strip 28. In FIG. 3 the continuous type is P+. It is believed that the pinched poly fuse 38 will have the same characteristics as the pinched poly fuse 10 of FIGS. 1A and 1B.

Figure 4A:
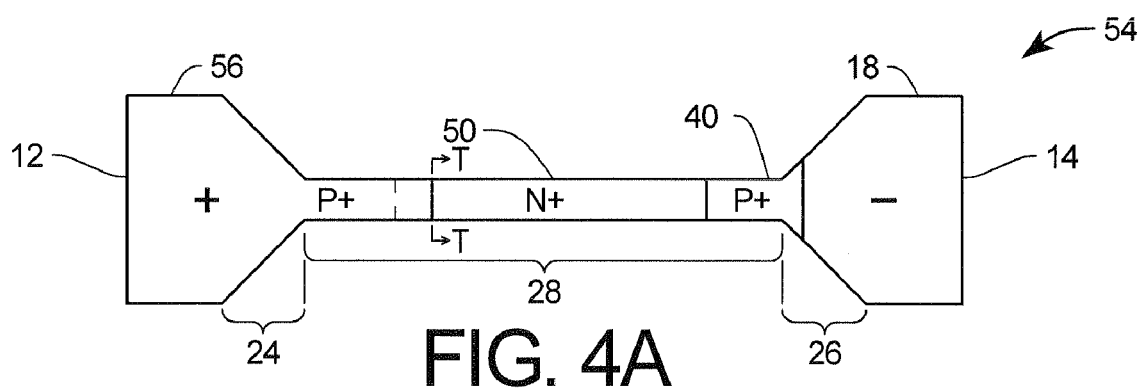
FIGS. 4A and 4B are respective top and side views of a fourth embodiment of a pinched poly fuse according to the present invention.
Figure 4B:
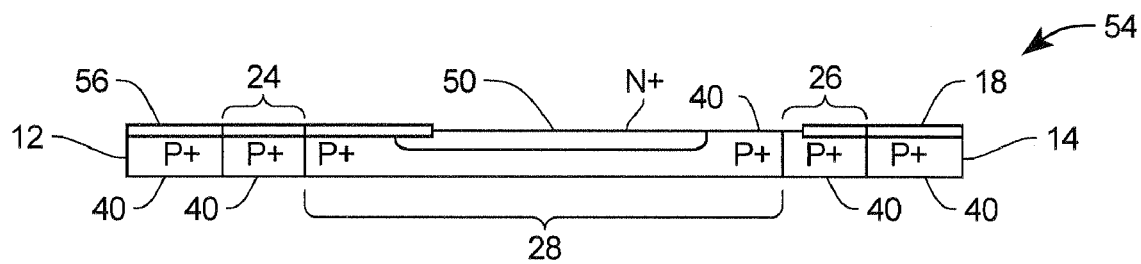

FIGS. 4A and 4B are respective top and side views of a fourth embodiment of a pinched poly fuse 54 according to the present invention and differs from the embodiment shown in FIGS. 3A and 3B in that the silicide layer 56 at the positive terminal 12 extends over and contacts the N+ region 50 to reverse bias the PN junction between the P+ polysilicon 40 and the N+ region 50. Although the silicide layer 56 extends across the trim origin T, it does not form a conductive path across the trim origin T and therefore does not interfere with the pinching of the P+ polysilicon 40 by the N+ region 50. Thus the silicide layer 56 does not necessarily have to be separated at the trim origin T when the pinched poly fuse 54 is opened as long as there is not a conductive path from the positive terminal 12 and the negative terminal 14 through the P+ polysilicon 40. In this situation the silicide layer 56 would be at the positive voltage at the positive terminal but would only be in contact with the P+ polysilicon 40 on the positive portion of the interrupted polysilicon and with the N+ region 50 which forms a reverse biased PN junction with the negative portion of the P+ region 50 connected to the negative terminal 14.

Figure 5A:
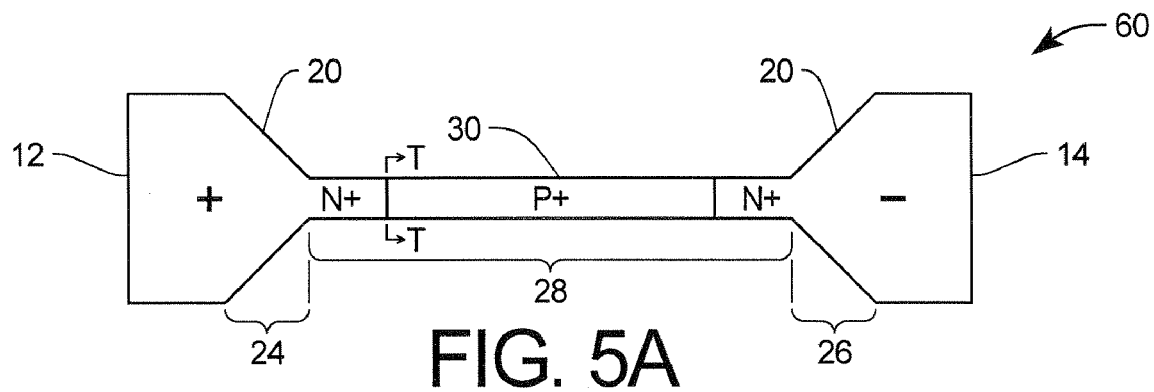
FIGS. 5A and 5B are respective top and side views of a fifth embodiment of a pinched poly fuse according to the present invention.
Figure 5B:
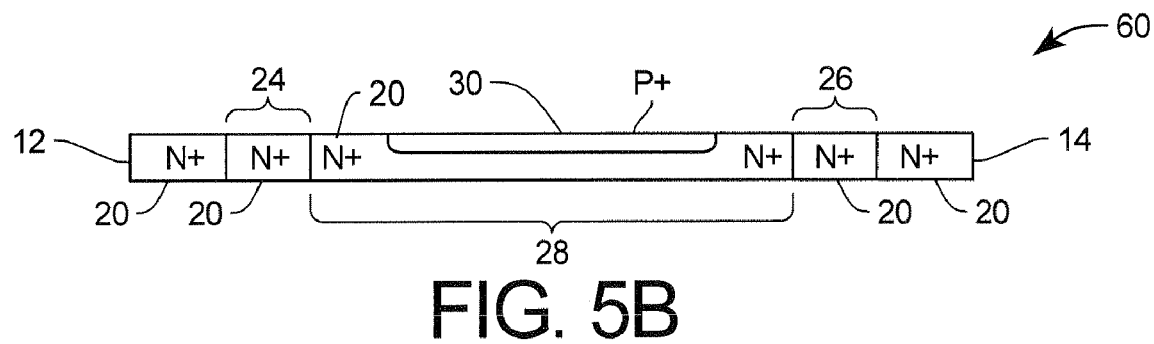

FIGS. 5A and 5B are respective top and side views of a fifth embodiment of a pinched poly fuse 60 according to the present invention and differs from the previous embodiments in that there is no silicide. In other words FIGS. 5A and 5B are FIGS. 1A and 1B, respectively, without any silicide.

Figure 5C:
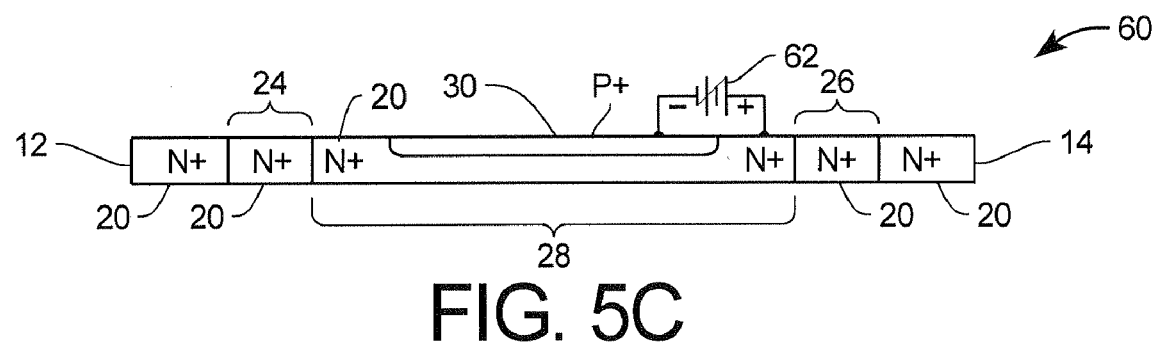
FIG. 5C is a side view of the pinched poly fuse shown in FIG. 5A with a reverse bias voltage applied to the PN junction.

FIG. 5C is a side view of the pinched poly fuse 60 shown in FIG. 5A with a reverse bias voltage 62 applied to the PN junction formed by the N+ polysilicon 28 and the P+ region 30. The reverse bias voltage would have the same effect as the reverse bias applied to the pinched poly fuse 34 shown in FIG. 2B is the voltage potential of the reverse bias voltage is the same as the voltage potential as the voltage difference between the positive terminal 12 and the negative terminal 14 of FIG. 2B. However, in FIG. 5C the magnitude of the reverse bias potential could be higher or lower than the magnitude of the reverse bias potential of FIG. 2B offering the possibility of optimizing the reverse bias voltage across the PN junction of FIG. 5C.

Figure 6A:
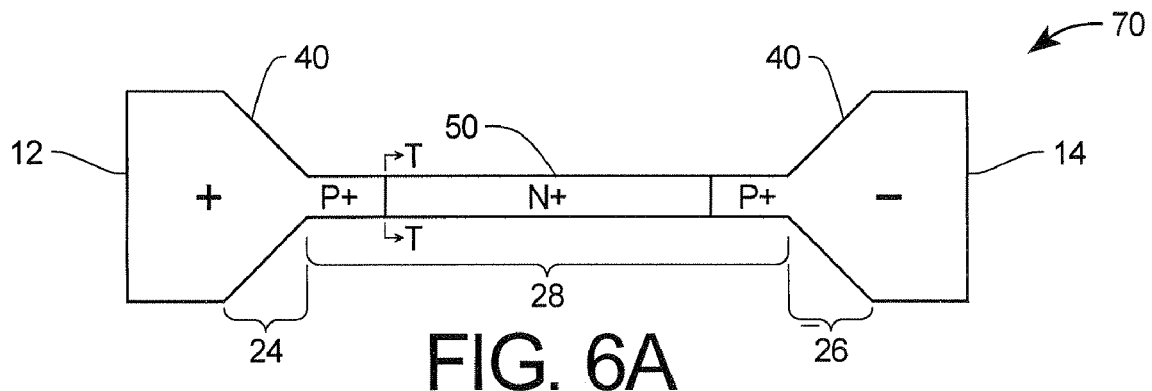
FIGS. 6A and 6B are respective top and side views of a sixth embodiment of a pinched poly fuse according to the present invention.
Figure 6B:
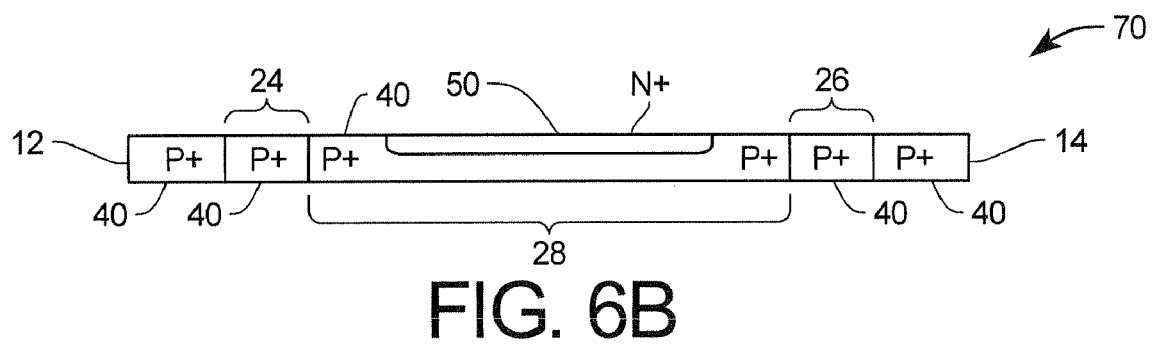
Figure 6C:
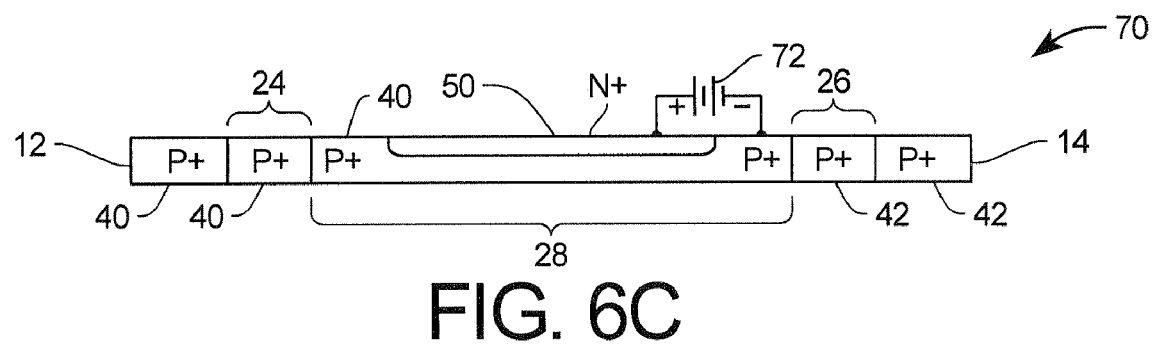
FIG. 6C is a side view of the pinched poly fuse shown in FIG. 6A with a reverse bias voltage applied to the PN junction.

FIGS. 6A, 6B, and 6C are respective top and two side views of a fifth embodiment of a pinched poly fuse 70 according to the present invention. The pinched poly fuse 70 has doped polysilicon that is the complement of the doped polysilicon of FIGS. 5A, 5B, and 5C in the same manner as the doped polysilicon of FIG. 2A is the complement of the doped polysilicon of FIG. 1A. It is believed that the operating characteristics of the pinched poly fuse 70 will be the same as the those of the pinched poly fuse 60.

While the invention has been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the scope of the invention.

Therefore, it is intended that the invention not be limited to the particular embodiments disclosed as the best mode contemplated for carrying out this invention, but that the invention will include all embodiments falling within the scope and spirit of the appended claims.

The invention claimed is:

1. An electrical fuse having a region of a first conductivity type in a continuous type polysilicon of a second conductivity type opposite said first conductivity type and end segments formed integrally with said continuous type polysilicon with silicide on at least a portion of each of said end regions.

2. The fuse of claim 1 wherein said region is elongated and lies in said continuous type polysilicon with its long axis parallel to a current path in said fuse.

3. The fuse of claim 2 wherein said continuous type polysilicon is elongated and said region extend across the width of said continuous type polysilicon.

4. The fuse of claim 3 wherein said region has an exposed surface in a same plane as an exposed surface of said continuous type polysilicon.

5. The fuse of claim 2 wherein said silicide is not in contact with said continuous type polysilicon.

6. The fuse of claim 2 wherein said silicide on one of said end segments is in contact with a portion of said region.

7. The fuse of claim 6 wherein said silicide in contact with said region is of a polarity to reverse bias a PN junction formed by said region and said continuous type polysilicon.

8. The fuse of claim 1 further including a voltage potential applied between said region and said continuous type polysilicon such that a PN junction between said region and said continuous type polysilicon is reverse biased.

9. The fuse of claim 1 wherein said continuous type polysilicon and said end segments are in a bowtie configuration.

10. A method of forming a polysilicon fuse comprising the steps of:
   a) forming a first region of continuous polysilicon of a first conductivity type;
   b) forming in said first region a second region of a conductivity type opposite to said first conductivity type; and
   forming silicide regions on each end of said polysilicon fuse.

11. The method of claim 10 wherein said second region is formed as an elongated region lying in said first region with its long axis parallel to a current path in said fuse.

12. The method of claim 11 wherein said first region is elongated and said second region extends across the width of said polysilicon fuse.

13. The method of claim 12 wherein said second region is formed with an exposed surface in a same plane as an exposed surface of said polysilicon fuse.

14. The method of claim 11 wherein said silicide is not in contact with said second region.

15. The method of claim 11 wherein said silicide formed on one end of said polysilicon fuse is in contact with a portion of said second region.

16. The method of claim 15 wherein one of said silicides is formed such that it is in contact with said first and second regions to reverse bias a PN junction formed by said first and second regions.

17. The method of claim 10 further including the step of creating a voltage potential across said first and second regions such that a PN junction between said first and second regions is reverse biased.

18. The method of claim 10 wherein said polysilicon fuse is formed in a bowtie configuration.

* * * * *